(12) United States Patent
Wikström et al.

(10) Patent No.: US 9,490,621 B2
(45) Date of Patent: Nov. 8, 2016

(54) HIGH-POWER SEMICONDUCTOR MODULE

(71) Applicant: ABB Technology AG, Zürich (CH)

(72) Inventors: Tobias Wikström, Egliswil (CH);
Thomas Setz, Veltheim (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/328,848

(22) Filed: Jul. 11, 2014

(65) Prior Publication Data
US 2015/0162738 A1   Jun. 11, 2015

(30) Foreign Application Priority Data

Dec. 7, 2013  (EP) .................................... 13176361

(51) Int. Cl.
| H01L 23/62 | (2006.01) |
| H02H 3/02 | (2006.01) |
| H01L 25/07 | (2006.01) |
| H01L 25/18 | (2006.01) |
| H02M 7/49 | (2007.01) |

(52) U.S. Cl.
CPC ............ *H02H 3/023* (2013.01); *H01L 25/072* (2013.01); *H01L 25/18* (2013.01); *H02M 7/49* (2013.01); *H01L 2924/0002* (2013.01)

(58) Field of Classification Search
CPC ..... H02H 3/023; H02M 7/49; H01L 25/072; H01L 25/18; H01L 2924/0002
See application file for complete search history.

(56) References Cited

U.S. PATENT DOCUMENTS

| 6,980,647 | B1 * | 12/2005 | Daugherty | ............ | H04M 19/00 |
| | | | | | 361/111 |
| 2010/0103631 | A1 * | 4/2010 | Tong | ....................... | G06F 21/86 |
| | | | | | 361/752 |
| 2015/0102852 | A1 * | 4/2015 | Limb | ..................... | H01L 23/14 |
| | | | | | 327/525 |

FOREIGN PATENT DOCUMENTS

| CN | 102801295 A | 11/2011 |
| JP | 11-297846 A | 10/1999 |

OTHER PUBLICATIONS

European Search Report issued on Sep. 13, 2013.

* cited by examiner

*Primary Examiner* — Victor A Mandala
(74) *Attorney, Agent, or Firm* — Taft Stettinius & Hollister LLP

(57) ABSTRACT

A high-power semiconductor module is disclosed, which can include a high-power semiconductor device mounted on the module and at least two electrical connections. The module can include a short-circuit device mounted on the module. The short-circuit device can generate a persistent electrically conducting path between the two electrical connections upon receiving a trigger signal by electrically destroying a semiconductor of the high-power semiconductor module.

19 Claims, 4 Drawing Sheets

HIGH-POWER SEMICONDUCTOR MODULE

RELATED APPLICATION

This application claims priority as a continuation application 35 U.S.C. §120 to EP13176361.7 filed as an European Application on Jul. 12, 2013 designating the U.S., the entire content of which is hereby incorporated by reference in its entirety.

FIELD

The disclosure relates to a high-power semiconductor module, a modular multilevel converter system and a method for bypassing a high-power semiconductor module.

BACKGROUND INFORMATION

A modular converter with a multilevel topology employing a plurality of high-power semiconductor modules may be well suited for many applications, as an increase in voltage may be achieved by increasing a number of levels. Also redundancy may be achieved by employing a plurality of such semiconductor modules. However, when a semiconductor module of a multilevel converter system is faulty, it may be desired to short the module's circuit in order to keep the system functioning in spite of the fault. The multilevel converter system then runs with one less module, but if the remaining modules are still operating within their safe limits, power conversion may continue almost without any noticeable change in output.

While so-called bipolar press-pack devices employed in modular multilevel converter systems, such as e.g. phase-controlled thyristors, diodes, GTOs, IGBTs or IGCTs, can be made to short-circuit upon a failure, not all conceivable failure events can be assumed to lead to a short-circuit reliably; the devices may be blocking but not controllable, i.e. they may not be turned on or off. An exemplary failure may be that control of a switch of a semiconductor module is lost for some reason, e.g. due to a faulty gate-unit, a broken fibre or any other fault. If the semiconductor module fails to close, a capacitor of the module may be over-charged or a highly increased voltage may eventually cause a breakdown of a part of the circuit, which in turn may result in a very energetic surge-current due to a release of the energy stored in the capacitor. A mechanical bypass switch, such as for example a magnetic or pyrotechnic switch, with a separate control may be a solution for ultimately bypassing a semiconductor module and putting it out of operation. Such a mechanical bypass switch may take up valuable module space, may be expensive and may involve regular service to ensure proper functioning.

SUMMARY

A high-power semiconductor module is disclosed comprising: a high-power semiconductor device mounted on a module housing and having at least two electrical connections; and a short-circuit device mounted on the module housing and configured to generate a persistent electrically conducting path between the two electrical connections upon receiving a trigger signal by electrically destroying a semiconductor of the high-power semiconductor module.

A method for bypassing a high-power semiconductor module is disclosed, comprising: detecting a failure of the high-power semiconductor module; generating a trigger signal when the failure is detected; and generating a persistent electrically conducting path between two electrical connections of the high-power semiconductor module upon receiving the trigger signal by electrically destroying a semiconductor of the high-power semiconductor module.

BRIEF DESCRIPTION OF THE DRAWINGS

The subject matter of the disclosure will be explained in more detail in the following text with reference to exemplary embodiments which are illustrated in the attached drawings, wherein.

In principle, identical parts are provided with the same reference symbols in the figures.

DETAILED DESCRIPTION

Figure 1:
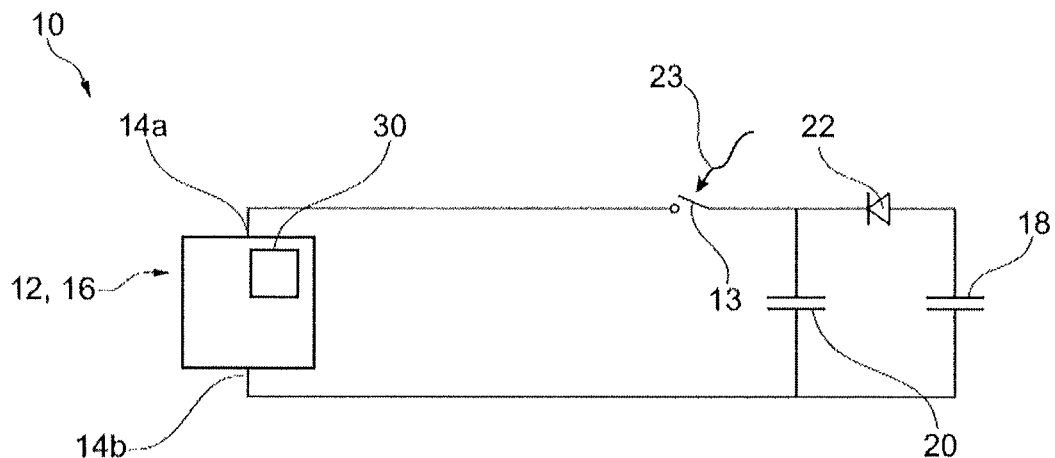
FIG. 1 schematically shows a circuit diagram of a high-power semiconductor module according to an exemplary embodiment of the disclosure.

A high-power semiconductor module is disclosed which can provide safe operation at low cost and without need of a regular service.

An exemplary aspect of the disclosure relates to a high-power semiconductor module, for example a semiconductor module of a modular multi-level converter. It should be understood that the term "high-power" may mean that a high-power semiconductor module may be adapted (i.e., configured), for example, for processing current above 10 A and/or voltage above 1000 V.

According to an exemplary embodiment of the disclosure, a high-power semiconductor module can include a high-power semiconductor device, which is mounted on the module (such as a module housing) and includes at least two electrical connections. The high-power semiconductor module can include a short-circuit device, which is also mounted on the module housing and which is adapted to generate a persistent electrically conducting path between the two electrical connections upon receiving a trigger signal. The persistent electrically conducting path can be generated by electrically destroying a semiconductor of the high-power semiconductor module.

In other words, the high-power semiconductor module may be electrically bypassed in a controlled manner by destroying a semiconductor of the module with an electrical signal upon any failure of the semiconductor module, such as for example a malfunctioning, blocking, or uncontrollable semiconductor junction or any other failure in an electric or electronic component of the module. Thereby, the two electrical connections of the high-power semiconductor device, which may be an anode and a cathode, may be electrically connected and thus short-circuited in order to safely discharge the entire module and/or put it out of operation.

The gist of the disclosure may be seen in an integration of an electronic self-destruction channel in a high-power semiconductor module, which may be used in a modular multi-level converter system and/or in a high-power semiconductor system with series redundancy.

The high-power semiconductor module may for instance be a converter module. For example, a converter may be an electrical device that is adapted to convert a first AC or DC current into a second AC or DC current, which differs from the first current in voltage and/or frequency.

In addition to the prescribed electrical bypass of the high-power semiconductor module, a mechanical bypass (e.g., a magnetic or pyrotechnic switch to short-circuit the high-power semiconductor device), may be mounted to the module in order to further increase safety.

According to an exemplary embodiment of the disclosure, the persistent electrically conducting path can be generated by destroying at least a part of a high-power semiconductor of the high-power semiconductor device and/or the persistent electrically conducting path can be generated by destroying at least a part of a short-circuit semiconductor of the short-circuit device.

Correspondingly, upon a failure of the semiconductor module, such as for example a blocking or uncontrollable semiconductor junction, an electrical signal may be supplied which may be powerful enough to locally destroy at least a part of a high-power semiconductor and/or at least a part of a short-circuit semiconductor of the semiconductor module, for instance by locally heating and melting the part of the corresponding semiconductor, which will generate the permanent electrical conducting path.

According to an exemplary embodiment of the disclosure, the short-circuit device may include a thyristor as short-circuit semiconductor and/or the high-power semiconductor device may include a semiconductor switch as high-power semiconductor, which may be adapted to switch an electric current, such as for example a thyristor, transistor, GTO, IGCT, IGBT and/or a diode.

Both the short-circuit device and the high-power semiconductor device may include a plurality of various different semiconductors; e.g., an assembly of semiconductors of different types, may be integrated in the high-power semiconductor module.

In accordance with an exemplary embodiment of the disclosure, the short-circuit device can include a short-circuit semiconductor providing a sacrificial region, which is configured for being destroyed by a current pulse triggered by the trigger signal.

This may mean that a region of the short-circuit device may be sacrificed by local destruction through a current filament in order to bypass the high-power semiconductor device. Thereby, the trigger signal may be an electrical signal or any other signal, such as for example an optical signal provided by a fiber-optic communication. The electrical trigger signal may be amplified if it is not powerful enough to provide the current pulse and to locally destroy the sacrificial region, whereas any other signal may be directly converted to the current pulse or converted to an electrical signal and also amplified if necessary. A current source converter, an inductor, a capacitor or an external current source may serve as power supply for providing the current pulse and/or for amplification of an electrical signal.

Apart from that, the actual current pulse destroying the semiconductor may also be provided by the high-power semiconductor device itself. More precisely, an electrical trigger signal may be provided upon a failure of the module. This trigger signal may serve to turn on the short-circuit device, for example to switch a thyristor of the short-circuit device, wherein the electrically conducting path may be generated between two electrical connections of the high-power semiconductor device. In turn, the high-power semiconductor may release electrical energy, which may for example be stored in a single or in a plurality of capacitors, providing a current pulse that is high enough to destroy at least a part of the short-circuit device's semiconductor.

For the turning on of the short-circuit device's semiconductor, the energy needed may be rather small. On the other hand, for the destruction of a semiconductor the supplied energy may, for example, be around 30 mJ in order to locally melt a semiconductor, such as for example a segment of a known GCT or thyristor. However, known capacitors applied in a high-power semiconductor device, such as for instance a turn-off channel capacitor for a GCT segment, may contain many multiples of that amount of energy if charged to about 20 V, and normally there are tens of such capacitors on a gate unit of a high-power semiconductor device. Accordingly, the energy for both strategies, the turning on of the short-circuit device's semiconductor as well as the destruction of a semiconductor of the module (e.g., a semiconductor of the short-circuit device or the high-power semiconductor device) may easily be provided.

According to an exemplary embodiment of the disclosure, the high-power semiconductor device can include a high-power semiconductor and the short-circuit device can include a short-circuit semiconductor which are arranged in a common substrate.

An integration of both the high-power semiconductor and the short-circuit semiconductor in a common substrate may allow to produce a rather compact high-power semiconductor module and may help to reduce a number of components of the module. This in turn may reduce costs for a production of the module and may simplify servicing the components. Apart from that, the integration in the common substrate may ensure that an electrically conducting path may be generated reliably because this path may be generated directly in the common substrate and no external components, such as for example a magnetic or pyrotechnic switch, may be used.

The high-power semiconductor module may also include a plurality of cells of common substrate, respectively, wherein each of the cells may include a high-power semiconductor and a short-circuit semiconductor as well as at least two electrical connections. Accordingly, the high-power semiconductor device may also include a plurality of high-power semiconductors, and the short-circuit device may also include a plurality of short-circuit semiconductors. Upon any failure of the module a persistent electrically conducting path between two electrical connections may be generated in each cell, respectively, or in a plurality of cells upon receiving the trigger signal. The electrically conducting paths within each cell may be generated as described in previous and in subsequent sections in order to put the entire module out of operation.

According to an exemplary embodiment of the disclosure, the short-circuit semiconductor is completely surrounded by the high-power semiconductor.

Such construction may simplify a production of the high-power semiconductor module and reduce production costs as well as it may allow to generate an electrically conducting path between the two electrical connections of the high-power semiconductor in a reliable manner by reducing a number of error-prone components of the module.

In accordance with an embodiment of the disclosure, a pole piece can be attached to a side of the high-power semiconductor, wherein the pole piece can include a hole with an insulated mount, for example, a spring-loaded contact pin for transmitting the trigger signal to the short-circuit semiconductor, and/or wherein the pole piece can include a trench with a control lead insulated mounted to the pole piece, which may be connected to the spring-loaded contact pin.

The control lead does not necessarily have to be contacted with the short-circuit semiconductor device by the spring-loaded contact pin, but may be contacted in any other suitable way, such as for example with a solder contact or a plug-in connection.

The pole piece may for instance include or may be made of copper or any other suitable electrically conducting material. The insulated mount for the contact pin may for example include a first region of a ceramic bushing brazed in the hole of the pole piece, thus being in contact with the pole piece for insulation, and a second region for contacting the contact pin with the control lead. The second region may for example be a copper bushing brazed in and insulated by the first region.

The trench for the control lead may simply be a channel in the pole piece which may be lined for instance with plastic, ceramic, or any other insulating material.

According to an exemplary embodiment of the disclosure, the high-power semiconductor device can include a free-wheeling diode arranged in the common substrate.

Generally a free-wheeling diode, which may also be known as flyback, suppressor or catch diode, may be used in order to eliminate flyback, which is a sudden spike in voltage occurring across an inductive load in a circuit when a power supply is suddenly reduced or removed. Hence by arranging a free-wheeling diode in the common substrate, voltage spikes as a consequence of for example a faulty and blocking semiconductor junction or a break-down of a part of a circuit connected to a power supply may be avoided.

According to another exemplary embodiment of the disclosure, the high-power semiconductor device and the short-circuit semiconductor device can be arranged in a disk of a common substrate. Thereby, the disk may include a middle region having the short-circuit semiconductor, a first annular region surrounding the middle region and including a free-wheeling diode, and a second annular region surrounding the first annular region and including the high-power semiconductor.

An arrangement of the short-circuit semiconductor, the free-wheeling diode, and the high-power semiconductor within a common substrate may facilitate production of a compact high-power semiconductor module at low cost. Moreover, by reducing the number of individual components, the number of error-prone components may be reduced which in turn may increase a reliability of the module.

The high-power semiconductor module may also include a plurality of cells, which may also be disk-like shaped, wherein each of the cells may include a high-power semiconductor, a short-circuit semiconductor, and a free-wheeling diode. Each of the cells may be electrically connected by two electrical connections, respectively. Accordingly, the high-power semiconductor device may include a plurality of high-power semiconductors and the short-circuit device may include a plurality of short-circuit semiconductors. Such a layout of the high-power semiconductor module may particularly apply to a module based on IGBTs. On such a module usually a plurality of IGBT cells is mounted on the module and connected in parallel. Upon any failure of the module a persistent electrically conducting path between two electrical connections may be generated in each IGBT cell, respectively, or in a plurality of IGBT cells upon receiving the trigger signal. The electrically conducting paths within each IGBT cell may be generated as described in previous and in subsequent sections in order to put the entire module out of operation.

According to yet another exemplary embodiment of the disclosure, the short-circuit device can include a capacitor for providing electrical energy for destroying at least a part of a semiconductor such that the electrically conducting path is generated and/or for triggering the short-circuit device; for example, for switching the short-circuit semiconductor of the short-circuit semiconductor device.

By equipping the short-circuit device with an individual and separate capacitor, a power supply for switching the short-circuit semiconductor and/or for locally destroying a semiconductor of the module may be ensured even if parts of the module may be faulty or standing idle for any reason, such as for example a broken circuitry.

According to another exemplary embodiment of the disclosure, the capacitor of the short-circuit device is connected to a capacitor of the high-power semiconductor device via a diode for preventing an unloading of the capacitor of the short-circuit device, when the capacitor of the high-power semiconductor device unloads.

The capacitor of the short-circuit device may be loaded by the high-power semiconductor device once the module is in operation. In case any failure of the module may occur during operation, it may be ensured that the capacitor of the short-circuit device may not discharge before the persistent electrically conducting path may be generated. For example even if a main gate unit of the high-power semiconductor device may short, the short-circuit device's capacitor may still be able to provide electrical energy for generating the electrically conducting path by preventing any backflow of current from the short-circuit device to the high-power semiconductor through the diode. This may ensure proper functioning of the short-circuit device and safe operation of the module.

Apart from that, the diode may serve to electrically separate the short-circuit device from the high-power semiconductor device while avoiding back-flow of power through an eventual short. This in turn allows mounting the short-circuit device and the high-power semiconductor device for example on a common printed circuit board of the module.

According to another exemplary embodiment of the disclosure, the short-circuit device can include a fibre-optic connection and a control circuitry for converting a trigger signal from the fibre-optic connection into an electrical trigger signal.

According to yet another exemplary embodiment of the disclosure, the high-power semiconductor device can include a fibre-optic connection and a control circuitry for processing control signals from the fibre-optic connection.

In a vicinity of the module rather strong electrostatic, magnetic and/or electromagnetic fields may be present due to rather strong currents flowing in the module. Therefore, contacting both or one of the short-circuit device and the high-power semiconductor device by fibre-optic connections may ensure that no disruption or electrical interferences may occur in the respective connection.

The control circuitries of both the short-circuit device and the high-power semiconductor device may for instance include a receiver for receiving signals, a converter for converting optical signals to electrical signal and vice versa, an amplifier for amplifying optical and/or electrical signals, a transmitter for transmitting optical and/or electrical signals, and/or a processing unit for processing optical and/or electrical signals.

Both the short-circuit device and the high-power semiconductor device may include a plurality of redundant fibre-optic connections and control circuitries in order to ensure proper communication and functioning of the entire module even if for example a fibre-optic connection may be disrupted. Apart from that, a redundancy in the connections and circuitries may provide a tool for registering erroneous signals. For example, if two signals, which may be supposed to be identical, strongly differ from each other, this may indicate an error.

A further aspect of the disclosure relates a modular multilevel converter system, which can for example include a plurality of high-power semiconductor modules as described previously and in subsequent sections. The modular multilevel converter system can include a controller for controlling the high-power semiconductor devices of the high-power semiconductor modules, wherein the controller is adapted (i.e., configured) for detecting a failure of a high-power semiconductor module and for providing a trigger signal to a short-circuit device for bypassing the failed high-power semiconductor device.

By increasing a number of high-power semiconductor modules an increase in voltage as well as a certain degree of redundancy may be achieved.

The controller of the modular multilevel converter system may include a receiver for receiving optical and/or electrical signals from the modules, a converter for converting optical signals to electrical signal and vice versa, an amplifier for amplifying optical and/or electrical signals, a transmitter for transmitting optical and/or electrical signals, and/or a processing unit for processing optical and/or electrical signals. All these components may be available in manifold manner to provide redundancy and to ensure proper functioning of the system.

A faulty module may for instance be detected by the controller by evaluating and/or interpreting a signal received from the corresponding module and by comparing that signal with reference values. The reference values may for instance be implemented in the controller or may be accessed by the controller, for example in a look-up table. Apart from that, for example an absence, a delay, a change in frequency, or a change in intensity of a module's signal may serve as indicator for a faulty high-power semiconductor module, such as for example a broken fibre, and may cause the controller to provide the trigger signal to the corresponding short-circuit device in response. Moreover, also a difference in signals provided by redundant fibre-optic connections, which may be supposed to be identical, may indicate a failure of a module's component.

Another aspect of the disclosure relates to a method for bypassing a high-power semiconductor module. An exemplary method can include detecting a failure of the high-power semiconductor module, generating a trigger signal, when the failure is detected, and generating a persistent electrically conducting path between two electrical connections of the high-power semiconductor module upon receiving the trigger signal by electrically destroying a semiconductor of the high-power semiconductor module.

The two electrical connections of the high-power semiconductor module may be two electrical connections of a high-power semiconductor device which may be mounted on the module as described in previous and in subsequent sections.

It has to be understood that features of the method as described in the above and in the following may be features of the system and/or the module as described in the above and in the following.

If technically possible but not explicitly mentioned, also combinations of embodiments of the disclosure described in the above and in the following may be embodiments of the method and the system.

These and other aspects of the disclosure will be apparent from and elucidated with reference to the embodiments illustrated in the Figures.

FIG. 1 schematically shows a circuit diagram of a high-power semiconductor module 10 according to an exemplary embodiment. The module 10 includes a high-power semiconductor device 12 with at least two electrical connections 14a, 14b, and a short-circuit device 16. The high-power semiconductor device 12 include comprise a thyristor, GTO, IGCT, IGBT, and/or a Diode as high-power semiconductor 30.

The high-power semiconductor device 12 can include a capacitor 18 which is electrically connected to a capacitor 20 of the short-circuit device 16 via a diode 22. The diode 22 can be adapted (i.e., configured) to inhibitor prevent an unloading of the capacitor 20 of the short-circuit device 16 when the capacitor 18 of the high-power semiconductor device 12 unloads. The capacitor 20 may have a smaller capacity than the capacitor 18.

The short-circuit device 16 can be adapted to generate a persistent electrically conducting path between the two electrical connections 14a, 14b by destroying a at least a part of the semiconductor 30 upon receiving a trigger signal 23, wherein the trigger signal 23 may be provided upon a failure of the module 10.

The short-circuit device 16 may include a shutter or switch 13, which is shut upon receiving the trigger signal 23. When the switch 13 is shut, electrical energy stored in the capacitor 20 of the short-circuit device 16 generates a current flowing through the semiconductor device 12. The current destroys the semiconductor 30 thereby generating the persistent electrical conducting path. The energy stored in the capacitor 20 may, thus, be large enough to heat a resistive path of the circuitry provided by the at least a part of the high-power semiconductor 30 in order to at least partially melt it and consequently generate the electrically conducting path.

Figure 2:
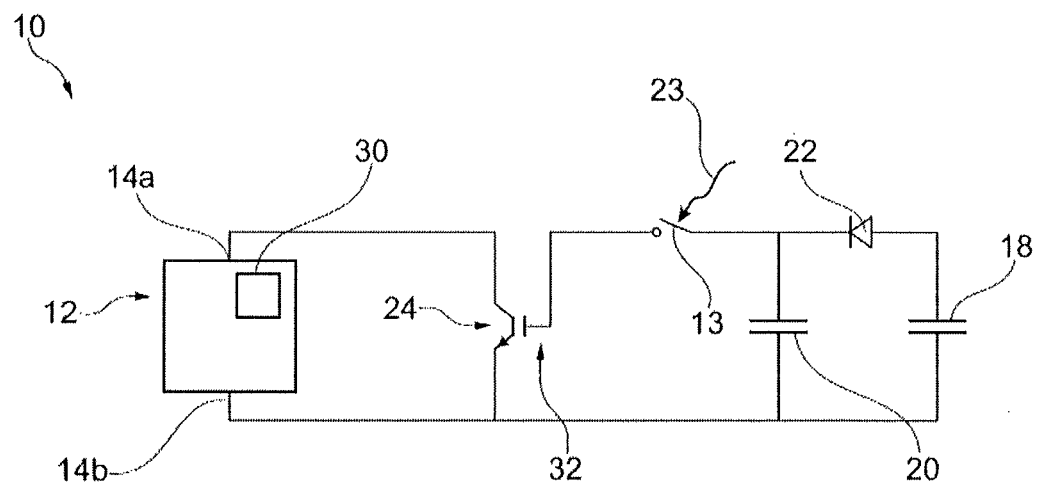
FIG. 2 schematically shows a circuit diagram of a high-power semiconductor module according to an exemplary embodiment of the disclosure.

FIG. 2 schematically shows a circuit diagram of a high-power semiconductor module 10 according to another exemplary embodiment, wherein the short-circuit device 16 includes a thyristor 24 as short-circuit semiconductor 32.

Upon receiving the trigger signal 23 the short-circuit device 16 may be triggered to switch the thyristor 24. The thyristor 24 may provide the electrically conducting path between the two electrical connections 14a, 14b and may short-circuit the module 10.

Figure 3:
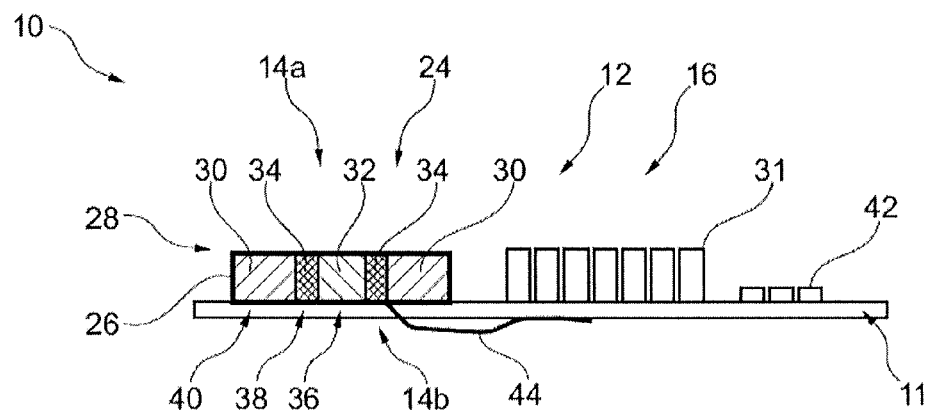
FIG. 3 schematically shows a cross-sectional side-view of a high-power semiconductor module according to an exemplary embodiment of the disclosure.
Figure 4:
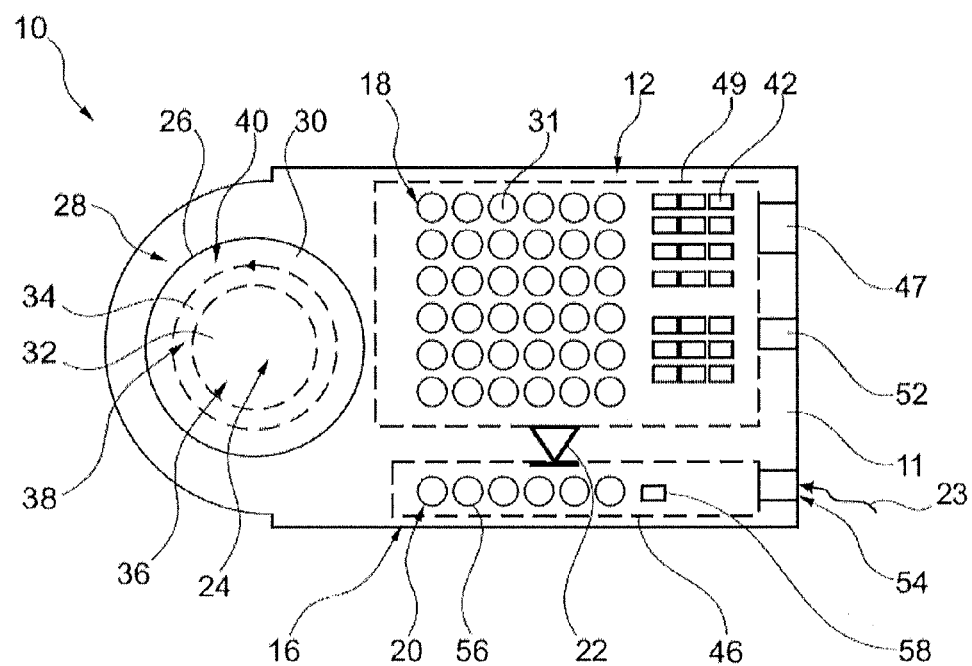
FIG. 4 schematically shows a top-view of an exemplary high-power semiconductor module of FIG. 3.

FIG. 3 schematically shows a cross-sectional side-view of a high-power semiconductor module 10. FIG. 4 shows a top view of the high-power semiconductor module 10 of FIG. 3.

The high-power semiconductor device 12 is mounted on a circuit board 11 of the module 10. The short-circuit device 16 is also mounted on the circuit board 11 of the module 10.

In a disk 26 of a common substrate 28 the high-power semiconductor 30 of the high-power semiconductor device 12, the short-circuit semiconductor 32 of the short-circuit device 16, and a free-wheeling diode 34 are arranged. More precisely, the disk 26 can include a middle region 36 having the short-circuit semiconductor 32 (e.g. thyristor 24), a first annular region 38 surrounding the middle region 36 and including the free-wheeling diode 34, and a second annular region 40 surrounding the first annular region 38 and comprising the high-power semiconductor 30.

The thyristor 24 may provide a sacrificial region of the substrate 28, which is configured for being destroyed by a current pulse provided by the capacitor 20 and triggered by the trigger signal 23. Complementary to the approach of destroying the sacrificial region of the thyristor 24 also a part of the high-power semiconductor 30 may be destroyed as is indicated in FIG. 1.

The high-power semiconductor device 12 can include a capacitor 18 with a plurality of capacitor members 31, which may be of an electrolytic or film type, and which may serve to provide energy for switching the high-power semiconductor 30, and a control electronic (gate unit) 42, which may for example be adapted for controlling the high-power semiconductor device 12. The control electronic 42 may for instance include a receiver, a converter, an amplifier, a transmitter, and/or a processing electronic. The control electronic 42 is connected to the gate of the thyristor 24 via a lead 44, which may be or may include a cable.

As indicated in FIG. 4 by the dashed circles in the disk 26, the short-circuit semiconductor 32 is arranged in the middle region 36 of the disk 26 and completely surrounded by the first annular region 38 which can include the freewheeling diode 34, and the first annular region 38 is in turn surrounded by the second annular region 40 which comprises the high-power semiconductor 30.

The member 26 does not necessarily have to be circularly shaped in cross-section, but may be shaped arbitrarily, such as for example elliptically, quadratically, or rectangularly. Moreover, the high-power semiconductor module 10 may not necessarily include only one disk 26, but may include a plurality of disks 26, which may be electrically connected in parallel or in series and which may be arranged in an arbitrary pattern on the module 10. This in turn means that also the high-power semiconductor device 12 may include a plurality of high-power semiconductors 30 and free-wheeling diodes 34, and the short-circuit device 16 may include a plurality of short-circuit semiconductors 32.

The module 10 can include a power supply 47 for supplying electrical energy to the module 10. The power supply 47 may for this purpose be connected to an external power source of any kind.

The power supply 47 may be electrically connected to a main circuitry 49 of the high-power semiconductor device 12. The main circuitry 49 can include the control electronic 42 and the plurality of capacitors 31. The main circuitry 49 may furthermore include a plurality of electrical lines connecting components of the high-power semiconductor device 12, wherein the electrical lines may for example be printed on the circuit board 11.

The high-power semiconductor device 12 further can include a fibre-optic connection 52 connected to the control circuitry 49. However, also a coaxial connection, a multi-core conductor or a flat conductor may be applied, for instance. The fibre-optic connection 52 can be adapted for transmitting; e.g., for receiving and/or sending optical signals and may be connected to a controller 96 (not explicitly shown, see FIG. 7). Optical signals received from the controller 96 may be converted to electrical signals by the control electronic 42. The electrical signals may further be amplified and/or processed, such as for example analyzed and/or interpreted, by the control electronic 42 in order to control the high-power semiconductor device 12, wherein the capacitors 31 may be actuated in order to switch the high-power semiconductor 30. Vice versa, electrical signals from the high-power semiconductor device 12 may be processed and/or converted to optical signals by the control electronic 42 and may be sent to a controller 96 (see FIG. 7) via the fibre-optic connection 52.

The high-power semiconductor device 12 may not only include a single fibre-optic connection 52, but may include a plurality of fibre-optic connections 52 which may be adapted for various tasks and/or which may be arranged for redundancy reasons.

The short-circuit device 16 can include a fibre-optic connection 54 connected to a short-circuit device circuitry 46. However, also a coaxial connection, a multi-core conductor or a flat conductor may be applied, for instance. The fibre-optic connection 54 may be connected to a controller 96 (see FIG. 7) and is arranged to receive a trigger signal 23 from the controller 96. Additionally, the fibre-optic connection 54 may serve to send optical signals to the controller 96.

The control circuitry 46 can include a capacitor 20 with a plurality of capacitor members 56, which may be of an electrolytic or film type, and which may be arranged for supplying the short-circuit device 16 with electrical energy. The control circuitry 46 may include electrical lines connecting the components of the short-circuit device 16, wherein the electrical lines may be printed on the circuit board 11.

At least one of the capacitors 56 of the short-circuit device 16 can be connected to at least one of the capacitors 31 of the high-power semiconductor device 12 by the diode 22. The diode 22 may serve as power supply for the short-circuit device 16 and is adapted for preventing an unloading of the capacitors 56 of the short-circuit device 16 when the capacitors 31 of the high-power semiconductor device 12 unload. In other words, the diode 22 is arranged to prevent a backflow of electrical energy from the short-circuit device 16 to the high-power semiconductor device 12 while allowing a flow of electrical current in the opposite direction.

Moreover, the control circuitry 46 can include a control electronic 58 of the short-circuit device 16, which may be adapted for converting a trigger signal 23 from the fibre-optic connection 54 to an electrical trigger signal. Accordingly, the control electronic 58 of the control circuitry 46 may include a receiver for receiving the trigger signal 23, a converter for converting the optical trigger signal 23 into an electrical trigger signal and an amplifier for amplifying the electrical signal.

The electrical trigger signal may be transmitted to the short-circuit semiconductor 32 via the control lead 44.

Figure 5:
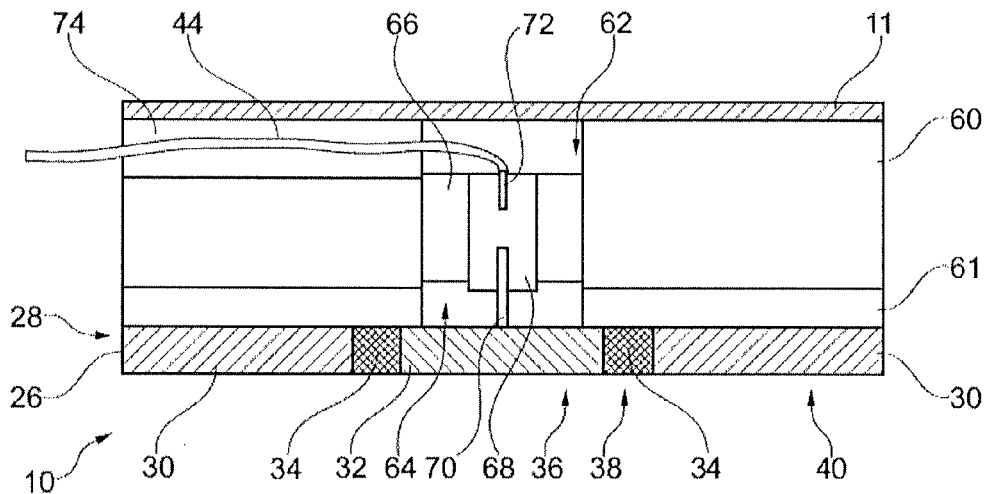
FIG. 5 schematically shows a cross section through a part of an exemplary high-power semiconductor module of FIG. 3.

FIG. 5 shows a cross section through a part of the high-power semiconductor module 10 of FIGS. 3 and 4. A pole piece 60 (which may be made of (i.e., consist of) or which may include copper) is arranged between the disk 26 and the circuit board 11. A further pole piece may be arranged at an opposite side of the disk 26. The pole pieces provide the electrical connections 14a, 14b and are arranged for electrically contacting the high-power semiconductor 30, the freewheeling diode 34, and the short-circuit semiconductor 32.

The pole piece 60 can include a trench 74 for accommodating the lead 44, which is guided by the trench 74 to the middle region 36 of the disk 26 in order to electrically connect the circuitry 46 of the short-circuit device 16 with the gate terminal of the short-circuit semiconductor 32. The lead 44 is insulated against the pole piece 60 by insulating material 73 inside the trench 74, for example ceramics material.

Between the disk 26 and the pole piece 60 a molybdenum disk 61 is arranged to provide a proper electrical connection of the disk 26 with the pole piece 60.

Both the pole piece 60 and the molybdenum disk 61 can include a hole 62 in a center part, respectively, with an insulated mount 64 for electrically connecting the lead 44 with the short-circuit semiconductor 32. Both the pole piece 60 and the molybdenum disk 61 may thus be donut-like shaped and may nearly completely cover one side of the disk 26.

The insulated mount 64 can include a ceramic bushing 66 brazed in the hole 62 of the pole piece 60 and being in direct contact with the pole piece 60. In a middle region of the ceramic bushing 66 a copper bushing 68 is brazed in. Hence, the copper bushing 68 is electrically insulated by the ceramic bushing 66 against the pole piece 60.

Furthermore, a contact pin 70 is arranged in a center part of the copper bushing 68. The contact pin 70 protrudes through the hole 62 and is pressed against the substrate 28. More precisely, the contact pin 70 is pressed against a surface of the short-circuit semiconductor 32 in order to provide an electrical contact between the short-circuit semiconductor 32 and the copper bushing 68. The contact pin 70, which may be made of for example copper or any other electrically conducting material (such as Au), may be spring-loaded.

On a side of the copper bushing 68 opposing the disk 26 of substrate 28, an end piece 72 of the lead 44 is electrically connected to the copper bushing 68. The end piece 72 is not insulated, whereas the lead 44 may be insulated in a middle part, for example by a plastic material. The end piece 72 may for example be plugged or brazed in the copper bushing 68 in order to electrically connect the control lead 44 with the contact pin 70.

A further end piece of the lead 44 is electrically connected to the control circuitry 46 of the short-circuit device 16 in order to transmit the electrical trigger signal provided by the control circuitry 46 via the copper bushing 68 to the spring-loaded contact pin 70 and to the short-circuit semiconductor 32.

Figure 6:
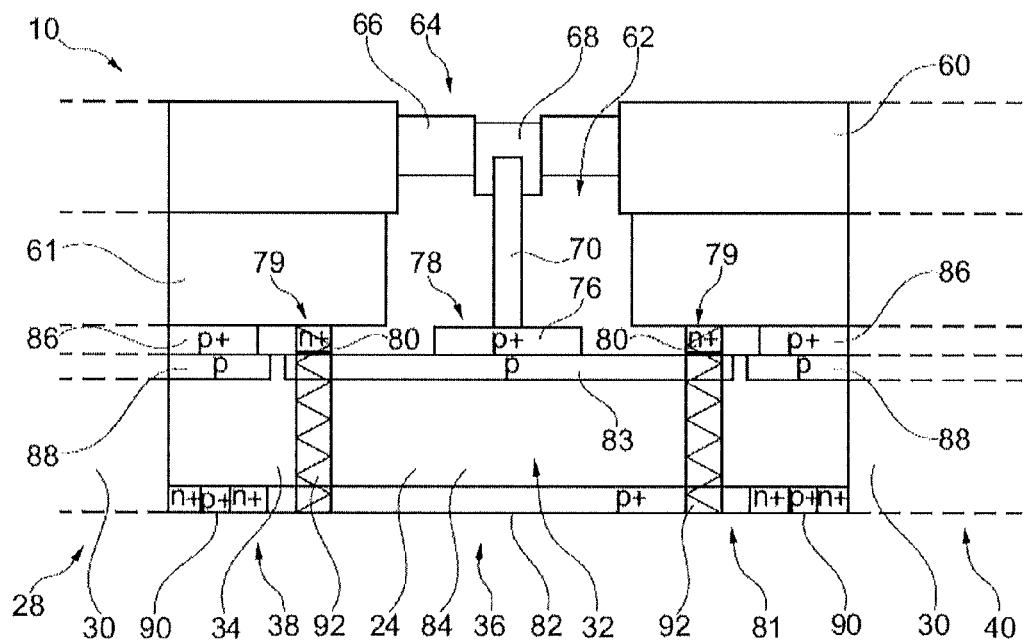
FIG. 6 schematically shows a cross-section through a part of the exemplary high-power semiconductor module of FIG. 3.

FIG. 6 schematically shows another cross-section through a part of the module 10 shown in FIGS. 3 and 4. FIG. 6 shows a cross-section through the middle region 36 and the first annular region 38 of the common substrate 28 of the disk 26 as well as through the pole piece 60 including the hole 62 with insulated mount 64 containing the contact pin 70. The second annular region 40, which may include a thyristor, GTO, IGCT, IGBT, and/or a diode as high-power semiconductor 30 is indicated by dashed lines extending on both sides of the free-wheeling diode 34 in the plane of projection of FIG. 6. Also the pole piece 60 and the molybdenum disk 61 extend on both sides of the free-wheeling diode 34, which is also indicated by dashed lines.

The contact pin 70 is in electrical contact with a highly p-doped section 76 of a thyristor 24 serving as short-circuit semiconductor 32. The highly p-doped section 76 is a gate terminal 78 of the thyristor 24. The gate terminal 78 is surrounded by an annularly shaped highly n-doped section 79, which serves as cathode 80 of the thyristor 24. On a side of the substrate 28 opposing the gate terminal 78, a highly p-doped section 81 is arranged which serves as anode 82 of the thyristor 24. Between the cathode 80 and anode 82, a p-doped section 83 is arranged adjacent to the gate terminal 78 and the cathode 80. Between the p-doped section 83 and the anode 82 an n-doped section 84 is arranged. The n-doped section 84 may be contained homogeneously within the whole disk 26 of substrate 28 and may serve to conduct charge carriers within the disk 26

On both sides of the thyristor 24 in the plane of projection of FIG. 6, the free-wheeling diode 34 can connect to the thyristor 24, wherein a highly p-doped anode 86 of the diode 34 is arranged adjacent to the molybdenum disk 61. Adjacent to the anode 86 of the diode 34 and between the anode 86 and n-doped section 84, a p-doped section 88 is arranged. On a side of the free-wheeling diode 34 opposing the molybdenum disk 61 and adjacent to the n-doped section 84, a cathode 90 of the free-wheeling diode 34 is arranged.

The p-doped sections 88 and 83 between the free-wheeling diode 34 and the thyristor 24 are separated from each other by the n-doped section 84. However, this separation of the p-doped sections 88 and 83 may not be necessary if the thyristor 24 does not turn on spontaneously during operation of the high-power semiconductor module 10 (for example due to a large change of voltage in time).

Upon receiving the optical trigger signal 23 via the fibre-optic connection 54, an electrical trigger signal may be provided the capacitors 56 to the gate terminal 78 of the thyristor 24. The electrical trigger signal may be powerful enough to destroy a part of the short-circuit semiconductor 32 of the thyristor 24 and/or it may turn the thyristor 24 on, wherein current flows from the anode 82 of the thyristor 24 to the cathode 80. This current may in turn heat a part of the thyristor 24 and generate a persistent electrically conducting path 92 between the anode 82 and the cathode 80 by melting said part of the thyristor 24. The electrically conducting path 92 may for instance be annularly shaped and located in the middle region 36 of the disk 26. The entire high-power semiconductor module 10 may be short-circuited and/or may be discharged safely via the persistent electrically conducting path 92.

A refined layout of the substrate 28 may not include the thyristor cathode 80 and the p-doped sections 88 and 83 may not be separated. In this case, a persistent electrically conducting path may be generated between the gate terminal 78 and the anode 86 of the free-wheeling diode, and the module 10 may discharge via this path.

Figure 7:
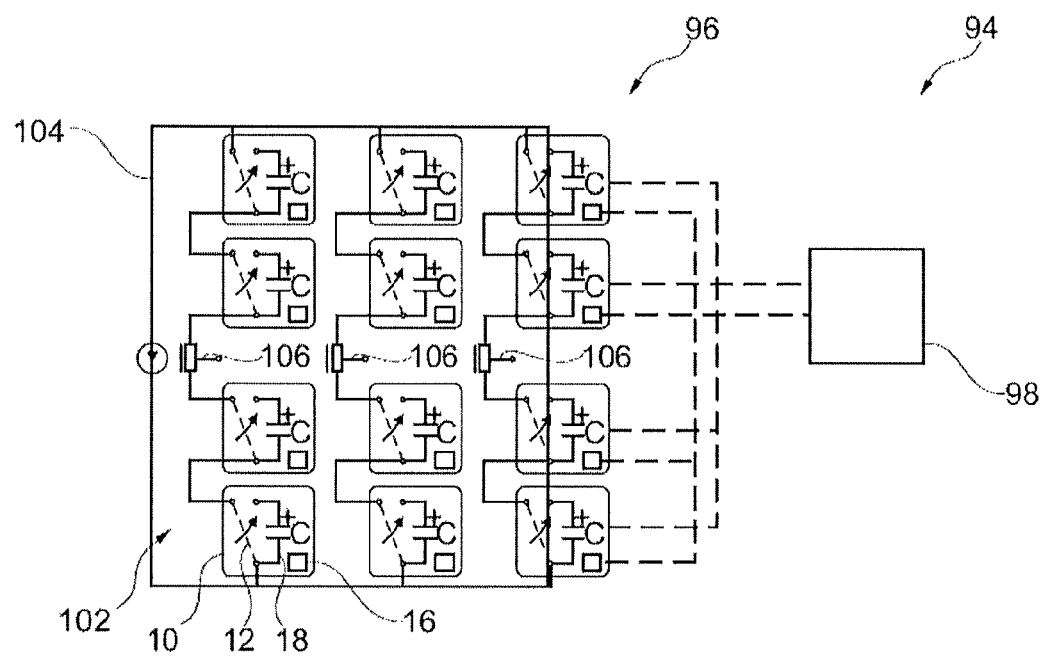
FIG. 7 schematically shows an exemplary system of a modular multilevel converter and its controller.

FIG. 7 schematically shows a system 94 of a modular multi-level converter 96 and its controller 96.

As a specific example, the modular multi-level converter 96 can include a plurality of high-power semiconductor modules 10, each of which includes a high-power semiconductor device 12 (indicated by a switch in FIG. 7), a capacitor 18 and a short-circuit device 16. The high-power semiconductor modules 10 are connected in series to form branches 102, which are on the one side connected to a DC-link 104 and on the other side to a phase output 106 of the converter 96. With high-power semiconductor devices 12 (including a semiconductor switch), the capacitor 18, which acts as a storage element of DC voltage, may be bypassed or inserted into the respective branch 102. Inserting/bypassing the capacitors 18 in the branch 102 allows impressing various voltage levels at the phase outputs 106.

By switching the high-power semiconductor devices 12 the converter 96 can be adapted for converting a DC voltage at the DC link to an AC voltage at each of the phase outputs 106. The phase outputs 106 of a modular multi-level converter may be connected to a power grid (active front end operation) or to a load (power inverter application).

There are other possible converter topologies for a modular multi-level converter 96, for example direct converter topologies, which are adapted for directly converting an AC voltage into another AC voltage.

The system 94 can include a controller 98 (for example based on a DSP or an FPGA), which receives control signals from the converter 96 and, optionally, another electrical system the converter is connected to. The controller 96 can also provide the gate signals for the modules 10 via the fibre-optic connection 42.

Figure 8:
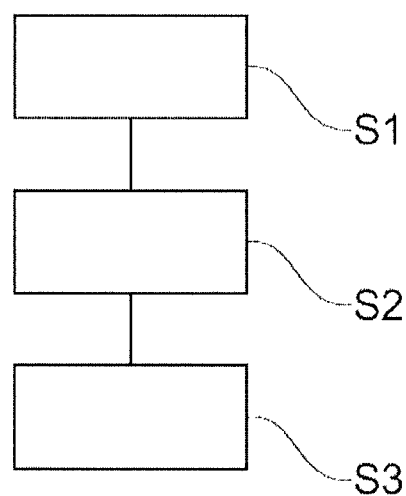
FIG. 8 shows a flow chart schematically illustrating a method of bypassing a high-power semiconductor module according to an exemplary embodiment of the disclosure.

FIG. 8 shows an exemplary method of bypassing a high-power semiconductor module 10, which may be executed by the controller 96 and at least one module 10.

In step S1, a failure of the high-power semiconductor module 10 is detected. For example, the controller 96 is, amongst other tasks, adapted to detect a failure of the modules 10. A failure of a module 10 may for example be detected if a control to one of the modules 10 is lost, which may for example be due to a faulty gate unit on one of the high-power semiconductor devices 12, a broken fibre-optic or any other fault, such as for example a malfunctioning, blocking or uncontrollable semiconductor junction. Also other failures in an electric or electronic component of a module 10 may be detected by the controller 96.

In step S2 a trigger signal 23 is generated, when the failure is detected. In this case, the controller may generate an optical trigger signal 23 that is sent to the corresponding short-circuit device 16 of the faulty module 10 via the fibre-optic connection 54.

In step S3, a persistent electrically conducting path 92 is generated between two electrical connections 14a, 14b of the high-power semiconductor module 10 by electrically destroying a semiconductor 30, 32 of the high-power semiconductor module 10 upon receiving the trigger signal 23. The short-circuit device 16 may receive the optical trigger signal 23 and may transform it into an electrical trigger signal, for example, by closing the switch 13.

As one alternative, a persistent electrically conducting path 92 is generated in the substrate of the semiconductor 30 of the high-power semiconductor device 12. As a second alternative or additionally, a persistent electrically conducting path 92 is generated in the substrate of a further semiconductor 32 of the short-circuit device 16.

In this way the faulty module 10 is short-circuited and bypassed, and the system 94 may still be functioning in spite of the fault. The multilevel converter system 94 may then run with one less module 10, but if the remaining modules 10 are still operating within their safe limits, power conversion can continue safely.

While the disclosure has been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those skilled in the art and practising the claimed disclosure, from a study of the drawings, the disclosure, and the appended claims. In the claims, the word "comprising" does not exclude other elements or steps, and the indefinite article "a" or "an" does not exclude a plurality. A single processor or controller or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

Thus, it will therefore be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE NUMERALS 10 high-power semiconductor module
11 circuit board
12 high-power semiconductor device
13 shutter
14a electrical connection
14b electrical connection
16 short-circuit device
18 capacitor
20 capacitor
22 diode
23 trigger signal
24 thyristor
26 disk
28 common substrate
30 high-power semiconductor
31 capacitor member
32 short-circuit semiconductor
34 free-wheeling diode
36 middle region
38 first annular region
40 second annular region
42 control electronic
44 lead
46 short-circuit device circuitry
47 power supply
49 main circuitry
52 fibre-optic connection
54 fibre-optic connection
56 capacitor member
58 control electronic
60 pole piece
61 molybdenum disk
62 hole
64 insulated mount
66 ceramic bushing
68 copper bushing
70 contact pin
72 end piece
73 insulating material
74 trench
76 p-doped section
78 gate terminal
79 n-doped section
80 cathode
81 p-doped section
82 anode
83 p-doped section
84 n-doped section
86 anode
88 p-doped section
90 cathode
92 electrically conducting path
94 system
96 modular multilevel converter 98 controller
102 branch
104 DC-link
106 phase output
S1 detecting a failure
S2 generating a trigger signal
S3 generating an electrically conducting path

The invention claimed is:

1. A high-power semiconductor module, comprising:
a high-power semiconductor device mounted on a module housing and having at least two electrical connections and a semiconductor arranged between the at least two electrical connections; and
a short-circuit device mounted on the module housing and configured to generate a persistent electrically conducting path between the at least two electrical connections upon receiving a trigger signal to electrically destroy the semiconductor of the high-power semiconductor module.

2. The high-power semiconductor module of claim 1, wherein at least a part of a high-power semiconductor of the high-power semiconductor device will be destroyed to generate the persistent electrically conducting path; and/or
wherein at least a part of a short-circuit semiconductor of the short-circuit device will be destroyed to generate the persistent electrically conducting path.

3. The high-power semiconductor module of claim 1, wherein the short-circuit device comprises:
a thyristor as a short-circuit semiconductor; and/or wherein the high-power semiconductor device comprises:
a thyristor, GTO, IGCT, IGBT and/or a diode as high-power semiconductor.

4. The high-power semiconductor module of claim 1, wherein the short-circuit device comprises:
a short-circuit semiconductor which provides a sacrificial region, which is configured for being destroyed by a current pulse triggered by the trigger signal.

5. The high-power semiconductor module of claim 1, wherein the high-power semiconductor device comprises:
a high-power semiconductor, and the short-circuit device includes a short-circuit semiconductor, which are arranged in a common substrate.

6. The high-power semiconductor module of claim 5, wherein the short-circuit semiconductor is completely surrounded by the high-power semiconductor.

7. The high-power semiconductor module of claim 5, comprising:
a pole piece attached to a side of the high-power semiconductor;
wherein the pole piece includes a hole with an insulated mount for a spring-loaded contact pin for transmitting the trigger signal to the short-circuit semiconductor; and/or
wherein the pole piece includes a trench with a control lead insulated mounted to the pole piece.

8. The high-power semiconductor module of claim 5, wherein the high-power semiconductor device comprises:
a free-wheeling diode arranged in the common substrate.

9. The high-power semiconductor module of claim 5, wherein the high-power semiconductor device and the short-circuit semiconductor device are arranged in a disk of a common substrate; and wherein the disk comprises:
a middle region including the short-circuit semiconductor, a first annular region surrounding the middle region and including a free-wheeling diode, and a second annular region surrounding the first annular region and including the high-power semiconductor.

10. The high-power semiconductor module of claim 1, wherein the short-circuit device comprises:
a capacitor for providing electrical energy for destroying of a semiconductor such that the electrically conducting path will be generated and/or for triggering the short-circuit device.

11. The high-power semiconductor module of claim 10, wherein the capacitor of the short-circuit device is connected to a capacitor of the high-power semiconductor device via a diode for preventing an unloading of the capacitor of the short-circuit device, when the capacitor of the high-power semiconductor device unloads.

12. The high-power semiconductor module of claim 1, wherein the short-circuit device comprises:
a fibre-optic connection, and a control circuitry for converting a trigger signal from the fibre-optic connection into an electrical trigger signal.

13. The high-power semiconductor module of claim 1, wherein the high-power semiconductor device comprises:
a fibre-optic connection, and a control circuitry for processing control signals from the fibre-optic connection.

14. A modular multilevel converter system, comprising:
a plurality of high-power semiconductor modules according to claim 1; and
a controller for controlling the high-power semiconductor devices of the high-power semiconductor modules, wherein the controller is configured for detecting a failure of a high-power semiconductor device and for providing a trigger signal to a short-circuit device for bypassing a failed high-power semiconductor device.

15. The high-power semiconductor module of claim 2, wherein the short-circuit device comprises:
a thyristor as a short-circuit semiconductor; and/or wherein the high-power semiconductor device comprises:
a thyristor, GTO, IGCT, IGBT and/or a diode as high-power semiconductor.

16. The high-power semiconductor module of claim 15, wherein the short-circuit device comprises:
a short-circuit semiconductor which provides a sacrificial region, which is configured for being destroyed by a current pulse triggered by the trigger signal.

17. The high-power semiconductor module of claim 16, wherein the high-power semiconductor device comprises:
a high-power semiconductor, and the short-circuit device includes a short-circuit semiconductor, which are arranged in a common substrate.

18. The high-power semiconductor module of claim 17, comprising:
a pole piece attached to a side of the high-power semiconductor;
wherein the pole piece includes a hole with an insulated mount for a spring-loaded contact pin for transmitting the trigger signal to the short-circuit semiconductor; and/or
wherein the pole piece includes a trench with a control lead insulated mounted to the pole piece.

19. The high-power semiconductor module of claim 18, wherein the high-power semiconductor device comprises:
a free-wheeling diode arranged in the common substrate.

* * * * *